(12) United States Patent
Shi et al.

(10) Patent No.: US 11,026,323 B2
(45) Date of Patent: Jun. 1, 2021

(54) FLEXIBLE DISPLAY PANEL, DISPLAY DEVICE AND MANUFACTURING METHOD THEREOF

(71) Applicant: BOE TECHNOLOGY GROUP CO., LTD., Beijing (CN)

(72) Inventors: Ling Shi, Beijing (CN); Benlian Wang, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 666 days.

(21) Appl. No.: 15/751,817

(22) PCT Filed: Jun. 27, 2017

(86) PCT No.: PCT/CN2017/090309
§ 371 (c)(1),
(2) Date: Feb. 9, 2018

(87) PCT Pub. No.: WO2018/040698
PCT Pub. Date: Mar. 8, 2018

(65) Prior Publication Data
US 2020/0221569 A1   Jul. 9, 2020

(30) Foreign Application Priority Data
Sep. 5, 2016   (CN) .......................... 201610805303.X

(51) Int. Cl.
*H05K 1/02*  (2006.01)
*H05K 1/18*  (2006.01)
*H05K 3/30*  (2006.01)

(52) U.S. Cl.
CPC ............. *H05K 1/028* (2013.01); *H05K 1/189* (2013.01); *H05K 3/303* (2013.01);
(Continued)

(58) Field of Classification Search
CPC ........ H05K 1/028; H05K 1/189; H05K 3/303; H05K 2201/09227; H05K 2201/09281;
(Continued)

(56) References Cited

U.S. PATENT DOCUMENTS

2002/0067456 A1*  6/2002  Tatsumi ................ G02F 1/1345
                                                            349/149
2010/0225624 A1   9/2010  Fu et al.
(Continued)

FOREIGN PATENT DOCUMENTS

CN        102013429 A      4/2011
CN        203368913 U     12/2013
(Continued)

OTHER PUBLICATIONS

Office Action received for Chinese Patent Application No. 201610805303.X, dated Mar. 21, 2018, 9 pages (3 pages of English Translation and 6 pages of Office Action).
(Continued)

*Primary Examiner* — Steven T Sawyer
(74) *Attorney, Agent, or Firm* — Womble Bond Dickinson (US) LLP

(57) ABSTRACT

A flexible display panel, a display device and a manufacturing thereof are disclosed. Hollow patterns are arranged in the lead wires in the bent region of the flexible display panel between the display region and the binding region. The hollow patterns can dissipate the stress accumulated on the lead wires during the bending and help the lead wires to release the stress when they are bent, thereby preventing breakage of the lead wires and improving the quality and reliability of the flexible display panel.

16 Claims, 5 Drawing Sheets

(52) U.S. Cl.
CPC .............. *H05K 2201/09227* (2013.01); *H05K 2201/09281* (2013.01); *H05K 2201/10128* (2013.01)

(58) Field of Classification Search
CPC . H05K 2201/10128; G09F 9/30; G09F 9/301; H01L 27/3276; H01L 51/0097; H01L 51/52; H01L 51/5203; H01L 2227/323; H01L 2251/5338; H01L 27/124; H01L 27/1218; G09G 3/3291; G09G 2300/0426; G09G 2380/02; Y02E 10/549
See application file for complete search history.

(56) References Cited

U.S. PATENT DOCUMENTS

| | | | | |
|---|---|---|---|---|
| 2014/0055328 | A1* | 2/2014 | Osako | H05K 1/0203 345/87 |
| 2014/0254111 | A1* | 9/2014 | Yamazaki | G04G 9/0088 361/749 |
| 2017/0256599 | A1* | 9/2017 | Kim | H01L 51/5203 |
| 2017/0352717 | A1* | 12/2017 | Choi | H01L 51/0097 |

FOREIGN PATENT DOCUMENTS

| | | |
|---|---|---|
| CN | 205140985 U | 4/2016 |
| CN | 106205394 A | 12/2016 |
| CN | 206058795 U | 3/2017 |
| KR | 10-2006-0036623 A | 5/2006 |

OTHER PUBLICATIONS

International Search Report received for PCT Patent Application No. PCT/CN2017/090309, dated Oct. 11, 2017, 6 pages (2 pages of English Translation and 4 pages of Original Document).

* cited by examiner

FLEXIBLE DISPLAY PANEL, DISPLAY DEVICE AND MANUFACTURING METHOD THEREOF

CROSS REFERENCE TO RELATED APPLICATION

This application is the U.S. national phase entry of PCT/CN2017/090309, with an international filling date of Jun. 27, 2017, which claims the priority benefits of the patent application No. 201610805303.X filed to the Chinese Patent Office on Sep. 5, 2016, the disclosure of which is incorporated herein by reference.

FIELD OF THE INVENTION

This disclosure relates to the field of flexible display technologies, and in particular to a flexible display panel, a display device and a manufacturing method thereof.

BACKGROUND

Flexible devices are used more and more widely in our lives. People attach increasing importance to flexible electronic devices, in particular flexible display panels, because of their characteristics such as light weight, thin thickness, flexibility or even foldability, and good mechanical performances. A flexible display panel is usually manufactured on a flexible carrier, which facilitates a narrow frame design due to its bendability. For example, a lateral side of the flexible display panel on which a control chip is provided can be bent towards a surface opposite a display surface of the flexible display panel, thereby achieving a narrow frame design. Since it is necessary to have signal lines in a display region extend to a binding region for electrical connection with the control chip, a plurality of lead wires will be arranged between the display region and the binding region. The lead wires will necessarily pass through a bent region, and as a radius of the bend of the flexible display panel gets smaller and smaller in the bent region, the lead wires become more easily broken here, which results in degradation of the quality of the flexible display panel or even damage and failure to the flexible display panel.

SUMMARY

To this end, embodiments of this disclosure provide a flexible display panel, a display device and a manufacturing method thereof, so as to alleviate or overcome the problem of easy breakage of lead wires of an existing flexible display panel in a bent region.

A flexible display panel is provided in an embodiment of this disclosure, the display panel comprising a display region and a bent region, the flexible display panel being bent in the bent region towards a surface opposite a display surface of the flexible display panel. The flexible display panel further comprises a plurality of lead wires located in the bent region, each lead wire being electrically connected with a signal line in the display region and each lead wire having a hollow pattern.

For the flexible display panel provided in this disclosure, in some embodiments, each lead wire in the bent region comprises at least two hollow patterns independent of each other.

In some embodiments, the hollow pattern comprises a plurality of repetitive sub-patterns, the repetitive sub-patterns being connected to one another so as to form a continuous hollow pattern extending in an extending direction of the lead wires.

Furthermore, in some embodiments, the sub-pattern comprises at least one selected from a group consisting of a polygonal line, an arc, a circle, an oval, a triangle, a rhombus and a polygon.

In some embodiments, an arrangement density of the repetitive sub-patterns depends on a radius of curvature of the bent region designed for the flexible display panel, and the smaller the radius of curvature is, the greater the arrangement density of the repetitive sub-patterns is.

In some embodiments, for the plurality of lead wires, the sub-patterns included in the hollow patterns for the plurality of lead wires are identical.

In some embodiments, the sub-patterns of the hollow patterns of every two adjacent lead wires shift relative to each other by a distance of smaller than one sub-pattern in the extending direction of the lead wires.

In some embodiments, each lead wire comprises at least two continuous hollow patterns, the at least two continuous hollow patterns being located in one and the same line and spaced from each other by a certain distance.

In some embodiments, the lead wires have a line width greater than that of the signal lines connected therewith.

In some embodiments, the lead wires in the bent region have a rectangular contour.

In some embodiments, the sub-patterns are zigzag polygonal lines.

In some embodiments, each lead wire only comprises one continuous hollow pattern, the continuous hollow pattern extending along a straight line that comprises a center point of the lead wire and has the same extending direction as that of the lead wire.

In some embodiments, the lead wires have a line width of 10 μm-50 μm.

In some embodiments, the flexible display panel further comprises a binding region for arranging a control chip, the bent region being located between the display region and the binding region, and the lead wires being further electrically connected with the control chip.

A display device is provided in another embodiment of this disclosure, and the display device can comprise the flexible display panel according to any of the above embodiments, and a control chip arranged in the binding region of the flexible display panel.

A method for manufacturing the display device according to the above embodiment is provided in yet another embodiment of this disclosure, and the method may comprise the following steps: forming a flexible display panel comprising lead wires with hollow patterns in a bent region; arranging a control chip in a binding region of the flexible display panel; and bending the flexible display panel in the bent region towards a surface opposite a display surface of the flexible display panel.

DETAILED DESCRIPTION OF EMBODIMENTS

Figure 1:
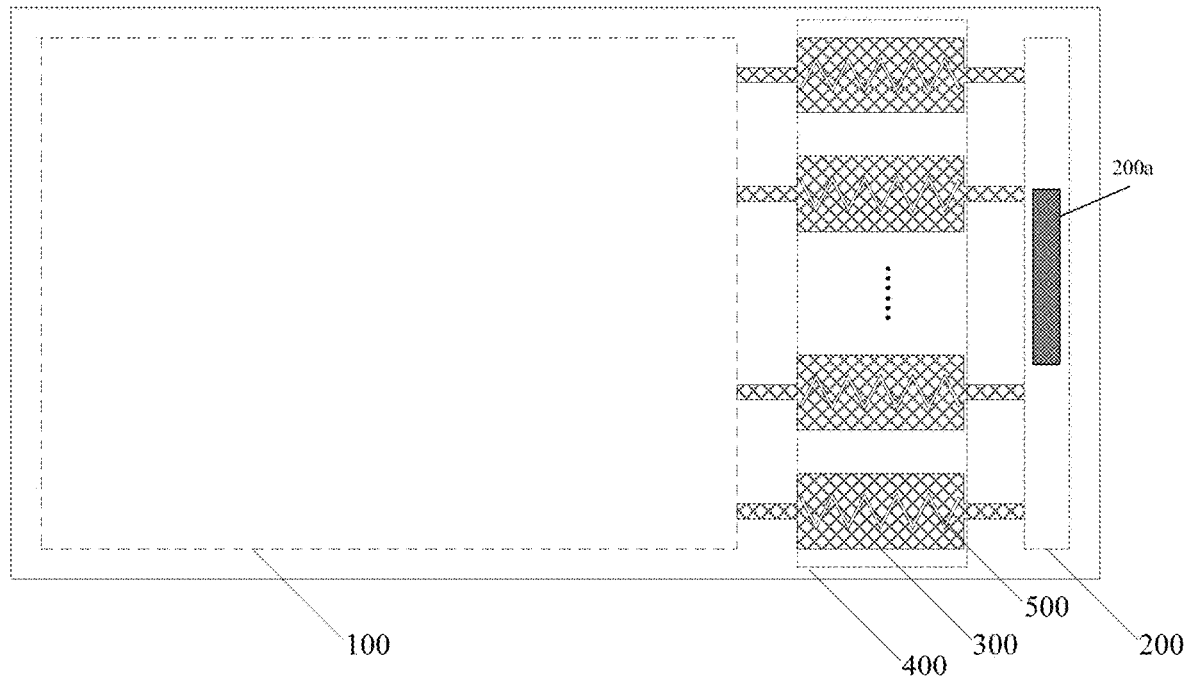
FIG. 1 schematically shows a plan view of the flexible display panel provided in an embodiment of this disclosure in an unbent state.

Specific implementations of the flexible display panel, the display device and the manufacturing thereof provided in the embodiments of this disclosure will be described below in detail with reference to the drawings.

Shapes and sizes of components in the drawings do not reflect the true scale of the flexible display panel, but instead they are only provided to illustrate the embodiments provided in this disclosure.

Figure 2A:
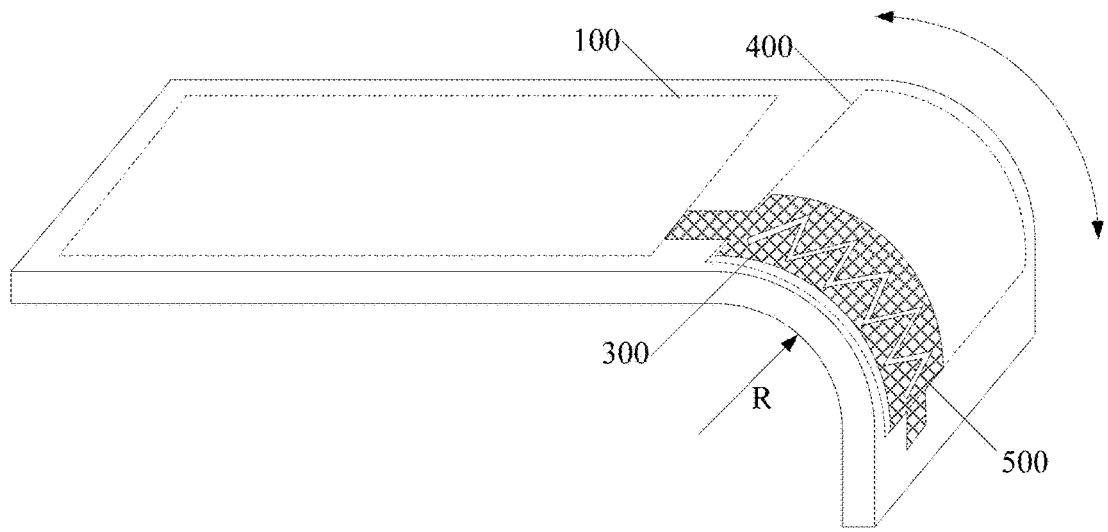
FIGS. 2a and 2b are schematic views of the flexible display panel provided in an embodiment of this disclosure in a bent state.
Figure 2B:
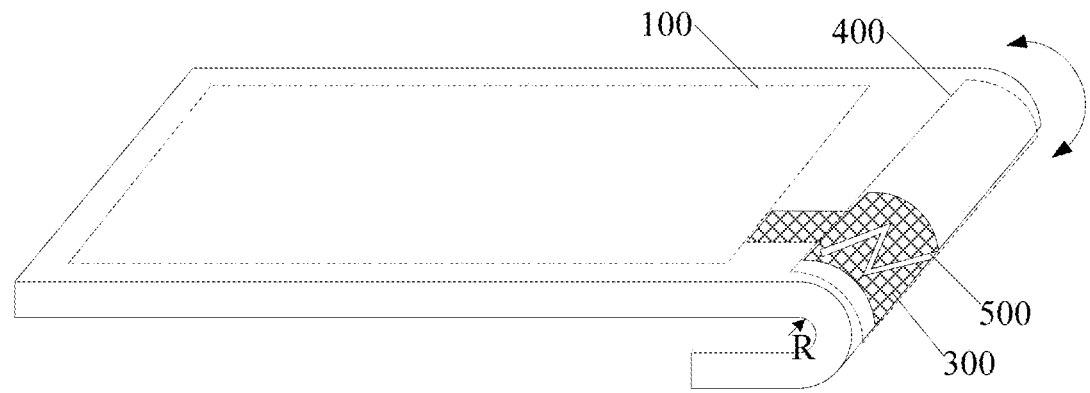

The embodiments of this disclosure provide a flexible display panel comprising a display region 100 and a bent region 400 as shown in FIG. 1, the flexible display panel can be bent in the bent region 400 towards a surface opposite a display surface of the flexible display panel. The flexible display panel further comprises a binding region 200 with control chip a 200a, a plurality of lead wires 300 located in the bent region 400, each lead wire 300 being electrically connected with a signal line in the display region and each lead wire having a hollow pattern 500. As shown in FIGS. 2a and 2b, the flexible display panel can be bent in the bent region 400 towards a surface opposite the display surface of the flexible display panel with a preset radius R.

Inventors of the present application have found that one of the important reasons for possible breakage of the lead wires in the bent region is that stress may be accumulated on the lead wires when they are bent, and the smaller the radius of curvature is, the greater the stress is, and in turn the more easily the lead wires break. In the flexible display panel provided in the embodiments of this disclosure, since the lead wires 300 in the bent region 400 are provided with hollow patterns 500, the hollow patterns can dissipate the stress accumulated on the lead wires 300 during the bending and help the lead wires 300 to release the stress when they are bent, which prevents breakage of the lead wires 300 and improves the quality and reliability of the flexible display panel.

Notably, for the flexible display panel provided in the embodiments of this disclosure, the degree in which the flexible display panel is bent in the bent region 400 can be set upon actual needs, for example, it can be bent at 90 degrees as shown in FIG. 2a, or at 180 degrees as shown in FIG. 2b. The flexible display panel can be further bent at any angle not greater than 180 degrees. In some embodiments, the radius of curvature R is not smaller than the thickness of the flexible display panel, and the minimum radius of curvature R can reach 0.2 mm.

In a specific implementation, in the flexible display panel provided in the embodiments of this disclosure, in order to facilitate the arrangement of the hollow patterns 500 in each lead wire 300, as shown in FIG. 1, the lead wires in the bent region 400 can have a line width greater than that of the signal lines connected therewith. For instance, in some embodiments, the lead wires beyond the bent region 400 have a line width of about 3 μm, and the lead wires 300 in the bent region 400 have a line width greater than 3 μm. Specific values of the line width of the lead wires 300 in the bent region 400 can be selected in the range of 10 μm-50 μm according to the overall size of the flexible display panel.

Moreover, in some embodiments, in order to ensure integrity of the lead wires 300, in the flexible display panel provided in the embodiment of this disclosure, as shown in FIG. 1, the lead wires 300 in the bent region 400 have a contour similar to that of the lead wires beyond the bent region 400, e.g., in the shape of a rectangle.

Figure 3A:
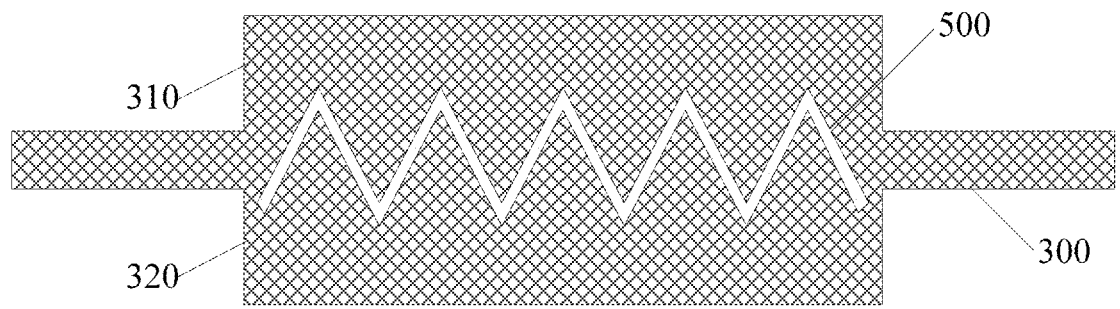
FIGS. 3a and 3g are respectively schematic views of the lead wires in the flexible display panel provided in different embodiments of this disclosure.

In some embodiments, as shown in FIG. 3a, the lead wire 300 in the bent region 400 can be divided into at least two sub-regions 310 and 320 by the hollow patterns 500. In this way, during the bending of the flexible display panel, in case of breakage of one sub-region 310 of the lead wire 300, the other sub-region 320 can continuously function to transfer signals such that the flexible display panel can work normally.

Figure 3B:
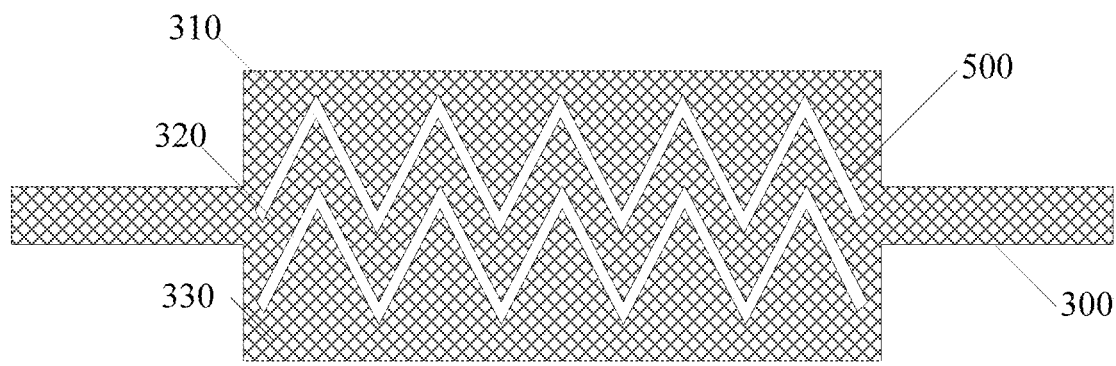
Figure 3C:
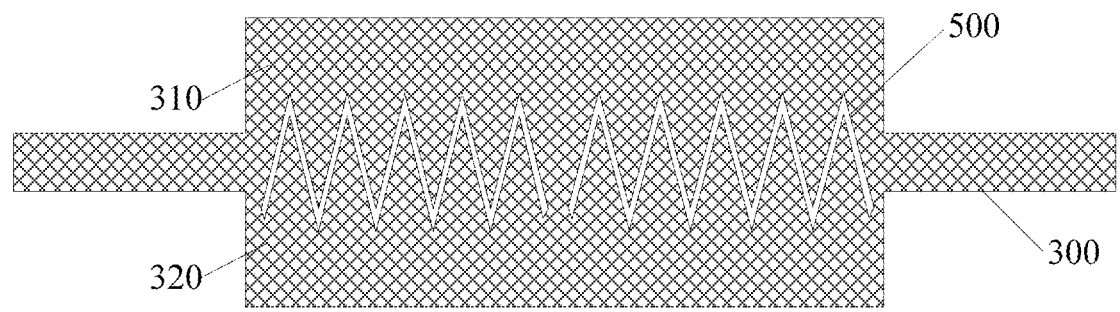

Specifically, in the flexible display panel provided in the embodiments of this disclosure, each lead wire 300 can be provided with in the bent region 400 either one hollow pattern 500 as shown in FIG. 3a, alternatively, a plurality of hollow patterns 500 as shown in FIGS. 3b and 3c can be formed in the lead wire 300, which will not be limited herein.

Therefore, in some embodiments, each lead wire in the bent region comprises at least two hollow patterns independent of each other. For instance, as shown in FIG. 3b, a plurality of independent hollow patterns 500 can be arranged in parallel in a direction perpendicular to the extending direction of the lead wire 300. In this case, the lead wire 300 can be divided into a plurality of sub-regions 310, 320 and 330 by the hollow patterns 500 (the number of the sub-regions is the number of the hollow patterns 500 plus 1). For this embodiment, the stress accumulated on the lead wires 300 can be released to the greatest extent, which prevents abnormality of the flexible display panel caused by complete breakage of the whole lead wire 300.

Alternatively, in another embodiment, each lead wire may comprise at least two continuous hollow patterns, the at least two continuous hollow patterns being substantially located in one and the same line and spaced from each other by a certain distance. As shown in FIG. 3c, two hollow patterns 500 are substantially located in one and the same line and spaced from each other by a certain distance. In this case, the lead wire 300 can be divided into two sub-regions 310 and 320 by the hollow patterns 500, and the two sub-regions 310 and 320 may also have a connection point in a central portion of the bent region 400 apart from being interconnected at both ends of the bent region 400, which helps to reduce the resistance of the lead wire 300 in the bent region 400.

In some embodiments, for the flexible display panel provided in the embodiments of this disclosure, the hollow pattern comprises a plurality of repetitive sub-patterns, the repetitive sub-patterns being connected to one another so as to form a continuous hollow pattern extending in an extending direction of the lead wire. The sub-patterns can be either regular patterns or irregular patterns, which will not be limited herein. For example, as shown in FIGS. 3a-3g, each hollow pattern 500 comprises a plurality of repetitive regular sub-patterns arranged in the extending direction of the lead wire 300, the sub-patterns being connected with each other so as to form a continuous hollow pattern extending in the extending direction of the lead wire.

Figure 3D:
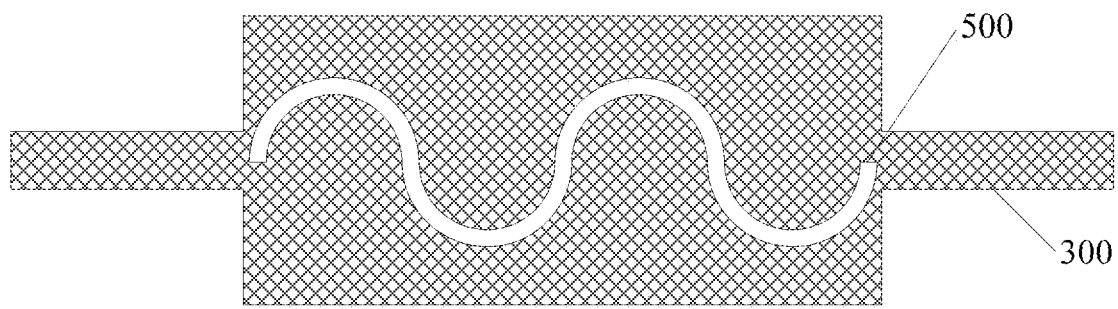
Figure 3E:
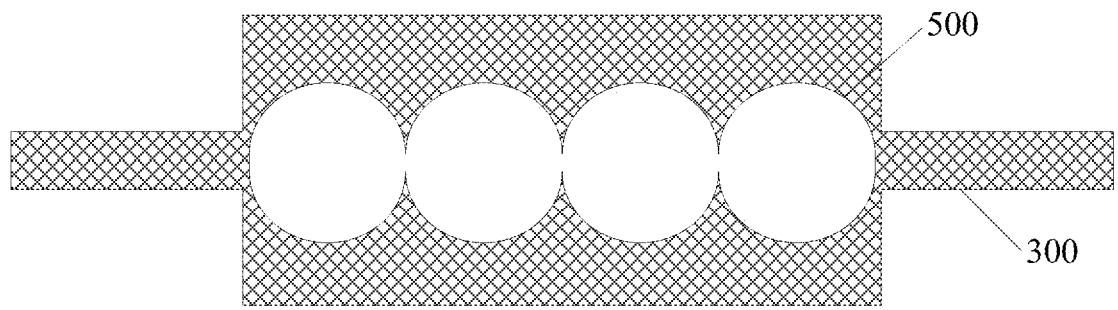
Figure 3F:
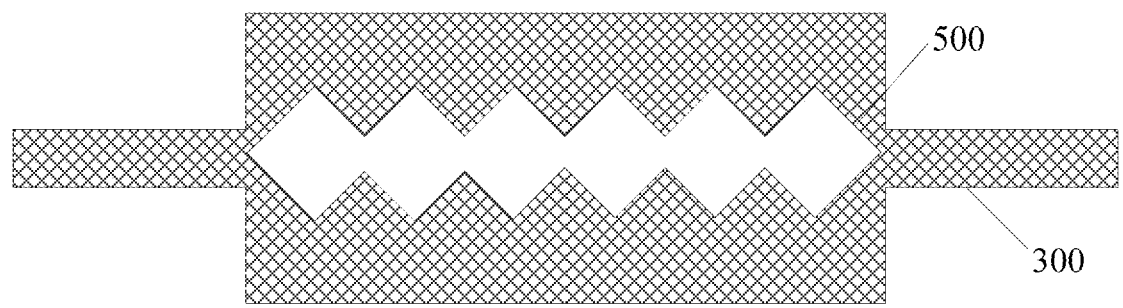
Figure 3G:
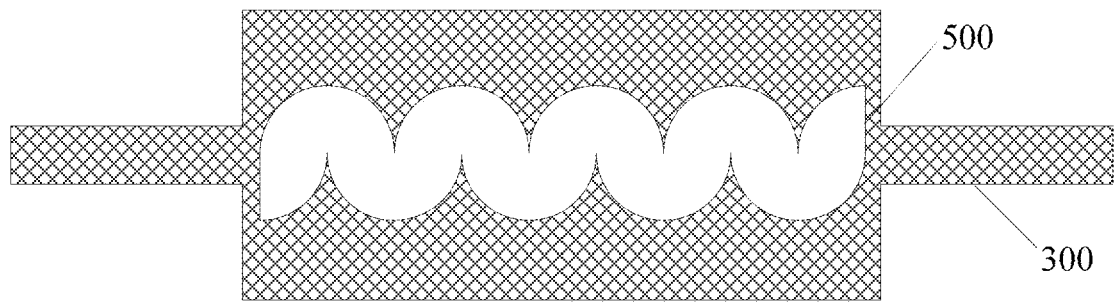

In specific implementation, in the flexible display panel provided in the embodiments of this disclosure, the sub-patterns constituting the hollow pattern 500 can comprise polygonal lines as shown in FIGS. 3A-3c, or arcs as shown in FIG. 3d, or circles or ovals as shown in FIG. 3e, or triangles, or rhombuses or polygons as shown in FIG. 3f, or other sub-patterns as shown in FIG. 3g, which will not be limited herein.

In some embodiments, in the flexible display panel provided in the embodiments of this disclosure, as shown in FIG. 3a, the repetitive sub-patterns comprised in the hollow pattern 500 are zigzag polygonal lines. In the embodiment as shown in FIG. 3a, each lead wire only comprises one continuous hollow pattern, the continuous hollow pattern extending along a straight line that comprises a center point of the lead wire and has the same extending direction as that of the lead wire.

In some embodiments, for the plurality of lead wires in the bent region, the hollow pattern of each lead wire comprises same sub-patterns. For example, as shown in FIG. 1, the lead wires 300 have the same sub-pattern in the bent region 400, e.g., they all consist of zigzag polygonal lines. In this way, the resistance of each lead wire 300 in the bent region 400 can be relatively constant or fluctuate subtly in an acceptable range.

Furthermore, in order to further dissipate the stress on each lead wire 300 in the bent region 400 and avoid excessive accumulation of the stress, in some embodiments, the sub-patterns of the hollow patterns of every two adjacent lead wires shift relative to each other by a distance smaller than a length of one sub-pattern in the extending direction of the lead wire. For example, as shown in FIG. 1, the hollow patterns of every two adjacent lead wires 300 can be arranged such that the sub-patterns of the two lead wires 300 shift relative to each other by a certain distance in the extending direction of the lead wire, and the distance is smaller than the length of one sub-pattern. In the example of FIG. 1, the sub-patterns in the shape of zigzag polygonal lines in two adjacent lead wires 300 shift relative to each other by a length occupied by an oblique segment of the sub-pattern in the shape of zigzag polygonal line, which can further dissipate the stress accumulation on the lead wires 300 during the bending and avoid possible breakage of the lead wires in the same position. Besides, in the flexible display panel provided in the embodiments of this disclosure, the arrangement density of the repetitive sub-patterns comprised in the hollow pattern depends on the radius of curvature of the bent region designed for the flexible display panel, and the smaller the radius of curvature is, the greater the arrangement density of the repetitive sub-patterns is. The smaller the radius R of curvature is, the more concentrated the stress generated in the bent region will be, and in turn the more easily the lead wires 300 break, so the arrangement density of the repetitive sub-patterns comprised in the hollow pattern should be increased so as to release the stress on the lead wires. In other words, the smaller the radius of the bend of the bent region 400 is, the greater the arrangement density of the repetitive sub-patterns comprised in the hollow patterns 500 is. For example, the arrangement density of the sub-patterns of the polygonal line as shown in FIG. 3c is greater than that of the sub-patterns of the polygonal line as shown in FIG. 3a.

Based on the same inventive concept, an embodiment of this disclosure further provides a display device comprising the flexible display panel according to any of the above embodiments of this disclosure, and a control chip in the binding region of the flexible display panel. The display device can be any product or component having a display function, such as a cellphone, a tablet computer, a television, a display, a notebook computer, a digital photo frame, a navigator and the like. For the implementation of the display device, the above embodiments of the flexible display panel can be referred to, which will not be repeated here for simplicity.

Figure 4:
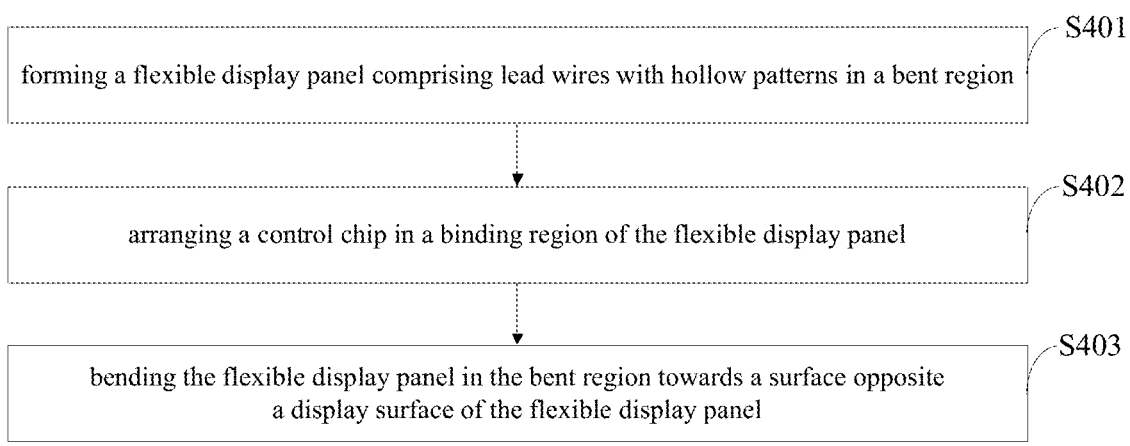
FIG. 4 is a flow diagram of a method for manufacturing the display device provided in an embodiment of this disclosure.

Based on the same inventive concept, an embodiment of this disclosure further provides a method for manufacturing the display device, as shown in FIG. 4, the method comprising the following steps:

S401, forming a flexible display panel comprising lead wires with hollow patterns in a bent region of the flexible display panel;

S402, arranging a control chip in a binding region of the flexible display panel;

S403, bending the flexible display panel in the bent region towards a surface opposite a display surface of the flexible display panel.

According to the flexible display panel, the display device and the manufacturing thereof provided in the embodiments of this disclosure, hollow patterns are formed in the lead wires in the bent region between the display region and the binding region, which can dissipate the stress accumulated on the lead wires during the bending and help the lead wires to release the stress when they are bent, thereby preventing breakage of the lead wires and improving the quality and reliability of the flexible display panel.

Obviously, those skilled in the art can make various modifications and variations to this disclosure without departing from spirits and scopes of the invention. Thus if these modifications and variations to this disclosure fall within the scopes of the claims of this disclosure and the equivalent techniques thereof, the invention is intended to include them too.

The invention claimed is:

1. A flexible display panel comprising a display region and a bent region, the flexible display panel being bent in the bent region towards a surface opposite a display surface of the flexible display panel, wherein the flexible display panel further comprises a plurality of lead wires in the bent region, each lead wire of the plurality of lead wires being electrically connected with a signal line in the display region and each lead wire comprising a hollow pattern,
   wherein the hollow pattern of each lead wire comprises a plurality of sub-patterns, the plurality of sub-patterns are identical in size and shape, the sub-patterns are connected to one another to form a continuous hollow pattern extending in an extending direction of the lead wires,
   wherein the sub-patterns of the hollow patterns of every two adjacent lead wires of the plurality of lead wires shift relative to each other by a distance in the extending direction of the lead wires, and the distance is greater than zero and smaller than a length of a single sub-pattern of the hollow pattern in the extending direction of the lead wires.

2. The flexible display panel according to claim 1, wherein each lead wire in the bent region comprises at least two hollow patterns independent of each other.

3. The flexible display panel according to claim 1, wherein the sub-pattern comprises at least one selected from a group consisting of a polygonal line, an arc, a circle, an oval, a triangle, a rhombus and a polygon.

4. The flexible display panel according to claim 1, wherein an arrangement density of the sub-patterns depends on a radius of curvature of the bent region designed for the flexible display panel, and the smaller the radius of curvature is, the greater the arrangement density of the sub-patterns is.

5. The flexible display panel according to claim 1, wherein each lead wire comprises at least two continuous hollow patterns, the at least two continuous hollow patterns being located in one and the same line and spaced from each other by a certain distance.

6. The flexible display panel according to claim 1, wherein each of the plurality of lead wires comprises a line width greater than that of the signal lines connected therewith.

7. The flexible display panel according to claim 1, wherein each of the plurality of sub-patterns comprises a zigzag polygonal lines.

8. The flexible display panel according to claim 1, wherein each lead wire only comprises one continuous hollow pattern, the continuous hollow pattern extending along a straight line that comprises a center point of the lead wire and has the same extending direction as that of the lead wire.

9. The flexible display panel according to claim 1, wherein the flexible display panel further comprises a binding region for arranging a control chip, the bent region being located between the display region and the binding region, and the lead wires being further electrically connected with the control chip.

10. A display device comprising the flexible display panel according to claim 1 and a control chip arranged in a binding region of the flexible display panel.

11. The flexible display panel according to claim 6, wherein the lead wires in the bent region comprises a rectangular contour.

12. A method for manufacturing the display device according to claim 10, comprising:
forming a flexible display panel comprising lead wires with hollow patterns in a bent region;
arranging a control chip in a binding region of the flexible display panel;
bending the flexible display panel in the bent region towards a surface opposite a display surface of the flexible display panel.

13. The display device according to claim 10, wherein each lead wire in the bent region comprises at least two hollow patterns independent of each other.

14. The display device according to claim 10, wherein the sub-pattern comprises at least one selected from a group consisting of a polygonal line, an arc, a circle, an oval, a triangle, a rhombus and a polygon.

15. The display device according to claim 10, wherein an arrangement density of the sub-patterns depends on a radius of curvature of the bent region designed for the flexible display panel, and the smaller the radius of curvature is, the greater the arrangement density of the sub-patterns is.

16. The flexible display panel according to claim 11, wherein the lead wire comprises a line width of 10 µm-50 µm.

* * * * *